United States Patent
Otremba

(10) Patent No.: US 7,663,212 B2
(45) Date of Patent: Feb. 16, 2010

(54) ELECTRONIC COMPONENT HAVING EXPOSED SURFACES

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 505 days.

(21) Appl. No.: 11/277,105

(22) Filed: Mar. 21, 2006

(65) Prior Publication Data

US 2007/0222044 A1     Sep. 27, 2007

(51) Int. Cl.
 *H01L 23/02*     (2006.01)
(52) U.S. Cl. ............... 257/678; 257/692; 257/707; 257/712; 257/E23.104
(58) Field of Classification Search ........... 257/676, 257/E23.104, 678
See application file for complete search history.

(56) References Cited

U.S. PATENT DOCUMENTS

| | | | | |
|---|---|---|---|---|
| 5,081,067 A * | 1/1992 | Shimizu et al. | .......... | 228/123.1 |
| 5,582,990 A | 12/1996 | Bergstrom et al. | ............. | 435/6 |
| 6,133,634 A | 10/2000 | Joshi | .......................... | 257/738 |
| 6,459,147 B1 | 10/2002 | Crowley et al. | ............. | 257/692 |
| 6,465,875 B2 | 10/2002 | Connah et al. | ............. | 257/666 |
| 6,476,481 B2 | 11/2002 | Woodworth et al. | ........ | 257/696 |
| 6,624,522 B2 | 9/2003 | Standing et al. | ............. | 257/782 |
| 6,646,329 B2 | 11/2003 | Estacio et al. | ............... | 257/666 |
| 6,767,820 B2 | 7/2004 | Standing et al. | ............. | 438/614 |
| 6,774,466 B1 * | 8/2004 | Kajiwara et al. | ............ | 257/673 |
| 6,777,800 B2 | 8/2004 | Madrid et al. | ............... | 257/690 |
| 6,841,865 B2 * | 1/2005 | Standing | ..................... | 257/696 |
| 6,861,286 B2 | 3/2005 | Estacio et al. | ............... | 438/108 |
| 6,870,254 B1 | 3/2005 | Estacio et al. | ............... | 257/692 |
| D503,691 S | 4/2005 | Standing et al. | ............ | D13/182 |
| 6,890,845 B2 | 5/2005 | Standing et al. | ............. | 438/614 |
| 6,891,256 B2 | 5/2005 | Joshi et al. | ................... | 257/676 |
| 6,893,901 B2 | 5/2005 | Madrid | ........................ | 438/122 |
| 6,930,397 B2 | 8/2005 | Standing et al. | ............. | 257/782 |
| 2001/0052641 A1 | 12/2001 | Kuo et al. | ..................... | 257/686 |
| 2002/0158345 A1 * | 10/2002 | Hedler et al. | ................ | 257/786 |
| 2002/0125550 A1 | 12/2002 | Estacio | ........................ | 257/666 |
| 2003/0001247 A1 | 1/2003 | Standing | ...................... | 257/678 |
| 2003/0019080 A1 | 1/2003 | Anthony et al. | .............. | 24/68 R |
| 2003/0052408 A1 | 3/2003 | Quinones et al. | ............ | 257/737 |
| 2004/0026796 A1 | 2/2004 | Standing et al. | ............. | 257/782 |
| 2005/0224960 A1 | 10/2005 | Standing et al. | ............. | 257/723 |
| 2006/0017174 A1 | 1/2006 | Otremba | ...................... | 257/778 |

FOREIGN PATENT DOCUMENTS

| | | |
|---|---|---|
| DE | 101 22 191 A1 | 8/2002 |
| DE | 102 49 206 B3 | 7/2004 |
| DE | 10 2004 030 042 A1 | 1/2006 |
| WO | WO 2004/038797 A1 | 5/2004 |

OTHER PUBLICATIONS

Sawle, Andrew et al.; Novel Power MOSFET Packaging Technology Doubles Power Density in Synchronous Buck Converters for Next Generation Microprocessors; International Rectifier; IEEE; 6 Pgs., 2002.

* cited by examiner

*Primary Examiner*—Thao X Le
*Assistant Examiner*—Ajay K Arora
(74) *Attorney, Agent, or Firm*—Banner & Witcoff, Ltd.

(57) ABSTRACT

An electronic component includes at least one vertical MOSFET device, a leadframe and a contact clip. A source electrode and gate electrode are provided on a lower surface of the MOSFET device and are mounted on a source portion and a gate portion, respectively, of the leadframe. The contact clip is electrically connected between the drain electrode, which is positioned on the upper surface of MOSFET device, and a drain portion of the leadframe.

24 Claims, 2 Drawing Sheets

ELECTRONIC COMPONENT HAVING EXPOSED SURFACES

TECHNICAL FIELD

The application relates to electronic components, in particular to electronic components which include a vertical semiconductor power switch, and to methods of assembling electronic components.

BACKGROUND

Due to the increasing demand for higher power semiconductor components, inefficient heat dissipation is an increasing problem. Poor heat dissipation can lead to instability of the semiconductor device and limit its functionality. Additionally, heat generated by power semiconductor devices can lead to overheating of neighboring devices mounted on the printed circuit board (PCB). This problem can limit the board design and component layout on the PCB.

In order to improve the heat dissipation from a semiconductor component, it is known to mount an additional heat dissipater on the outer surface of the semiconductor package or even directly on the semiconductor chip itself. The heat dissipater can have the form of a metal plate, for example. Additionally, the heat dissipater may include a plurality of outwardly extending fins in order to increase the surface area and further improve heat dissipation upwards away from the printed circuit board.

However, in vertical semiconductor devices, such as a power MOSFET, the upper side as well as the opposing lower side of the semiconductor device provides one or more contact areas which are electrically accessed, typically by bond wires. Consequently, it is complicated to mount the heat dissipater on vertical semiconductor devices.

SUMMARY

An electronic component comprises at least one vertical semiconductor power switch comprising a first surface and second surface, a leadframe and at least one contact clip. The first surface comprises at least one anode and at least one control electrode and the second surface comprises at least one cathode. The anode of the vertical semiconductor power switch is mounted on the upper surface of an anode portion of the leadframe and the control electrode of the vertical semiconductor power switch is mounted on a control portion of the leadframe. The contact clip comprises a flat web portion and at least one peripheral rim portion which extends from an edge of the flat web portion. A bottom surface of a flat web portion of the contact clip is mounted on, and electrically connected to the cathode, and a peripheral rim portion of the contact clip extends over, and is spaced from, a side face of the vertical semiconductor power switch. The contact clip is electrically connected to a cathode portion of the leadframe. The exposed surfaces of the contact clip and of the leadframe provide outer surfaces of the electronic component. In an embodiment, a moisture barrier layer is positioned on the exposed surfaces of the semiconductor power switch.

A method for assembling a semiconductor component comprises providing at least one vertical semiconductor power switch comprising a first surface and second surface, wherein the first surface comprises at least one anode and at least one control electrode and the second surface comprises at least one cathode, providing a leadframe, providing at least one contact clip having a flat web portion and at least one peripheral rim portion extending from an edge of the flat web portion, mounting and electrically connecting the anode of the vertical semiconductor power switch on the upper surface of an anode portion of the leadframe and the control electrode on a control portion of the leadframe, mounting and electrically connecting a bottom surface of the flat web portion of the contact clip on the cathode so that the peripheral rim portion extends over and is spaced from an edge of the vertical semiconductor power switch, electrically connecting the peripheral rim portion of the contact clip to a cathode portion of the leadframe. The exposed surfaces of the contact clip and of the leadframe provide outer surfaces of the electronic component.

DETAILED DESCRIPTION

Figure 1:
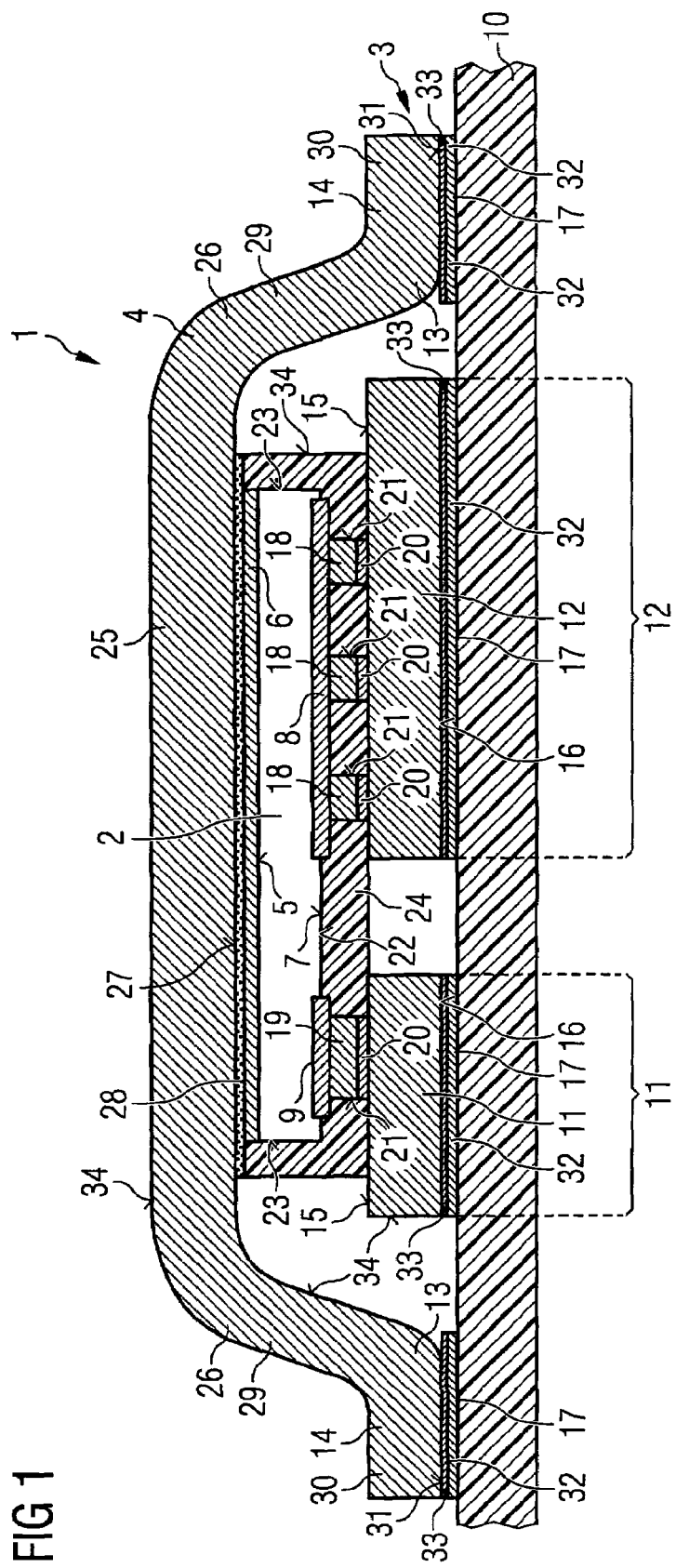
FIG. 1 illustrates an electronic component comprising a vertical MOSFET device according to a first embodiment.

In an embodiment, an electronic component comprises at least one vertical semiconductor power switch comprising a first surface and second surface and side faces extending between the first surface and the second surface. The first surface comprises at least one anode and at least one control electrode and the second surface comprises at least one cathode. In an embodiment, the second surface comprises a single cathode. The electronic component further comprises a leadframe comprising a structured sheet providing a plurality of separate portions. Each portion of the leadframe comprises an upper side and an underside. The underside of the leadframe portion provides a surface mountable outer contact surface of the electronic component. The electronic component further comprises at least one contact clip having a flat web portion and at least one peripheral rim portion extending from an edge of the flat web portion.

The anode of the vertical semiconductor power switch is mounted on the upper surface of an anode portion of the leadframe and the control electrode of the vertical semiconductor power switch is mounted on a control portion of the leadframe. The outer contact surfaces of the anode portion and of the control portion are positioned at least in part underneath the first surface of the vertical semiconductor power switch. A bottom surface of the flat web portion of the contact clip is mounted on, and electrically connected to, the cathode. The peripheral rim portion of the contact clip extends over and is spaced from a side face of the vertical semiconductor power switch and is electrically connected to a cathode portion of the leadframe. The exposed surfaces of the contact clip, and of the leadframe provide outer surfaces of the electronic component.

"Exposed surfaces" is used here to denote those surfaces not in direct surface-to-surface contact with a further element of the electronic component. The exposed surfaces are typically in contact with the ambient in which the electronic component is situated, such as in air.

The portions of the leadframe such as the anode portion and the control portion are physically separate.

The electronic component is provided without encapsulation and, therefore, without an outer plastic housing. Furthermore, the vertical semiconductor power switch is also provided without being embedded in a plastic encapsulation mass such as an epoxy resin. The exposed surfaces of the vertical semiconductor power switch also provide the outer surfaces of the electronic component.

The encapsulation-free electronic component provides an electronic component which is able to accommodate a vertical semiconductor power switch with a greater lateral area. Typically, space is reserved in order to accommodate the plastic encapsulation compound, for example, space is required to inject the plastic encapsulation and/or clamp an external mould onto the extremities of the electronic component. Since the electronic component is encapsulation free, this space is no longer reserved for the plastic encapsulation and may be occupied by the semiconductor power switch. The maximum size of the semiconductor power switch which can be accommodated is increased.

The leadframe and contact clip provide a three-dimensional rewiring structure. The arrangement of the outer contact surfaces of the leadframe provides is independent of the size of the semiconductor power switch. Consequently, different sizes of vertical semiconductor power switches can be accommodated within an electronic component having a fixed footprint. In this context, "footprint" refers to the arrangement of the outer contact surfaces since the electronic component is a surface mountable component. This simplifies the use of the electronic component since the higher-level circuit board, on which the electronic component is mounted by the customer, can be provided with a standard contact arrangement to match the standard footprint of the electronic component. Different grades or different powers of semiconductor power switch may be mounted to the standard printed circuit board since they can be accommodated within the electronic component due to the decoupling of the relationship between the footprint and the size of the semiconductor power switch by providing a rewiring structure.

In an embodiment of the invention, the exposed regions of the first surface of the vertical semiconductor power switch are provided with a moisture barrier coating or film. In an embodiment, the exposed regions of the first surface and the side faces of the vertical semiconductor power switch are provided with a moisture barrier coating or film. The moisture barrier layer hinders the deterioration of the performance of the vertical semiconductor power switch due to the degradation effects caused by moisture from the atmosphere. The outer surfaces of the moisture barrier layer, therefore, provide outer surfaces of the electronic component.

The performance and power rating of the semiconductor power switch is dependent on the lateral area of the semiconductor power switch. The encapsulation-free electronic component is able to accommodate a vertical semiconductor power switch having a higher power rating since the volume normally required to accommodate the flow of the plastic encapsulation material and/or mold is no longer required for this purpose and can be used to accommodate a larger semiconductor power switch.

The electronic component is provided with at least one vertical semiconductor power switch having a so-called flip-chip or anode down arrangement in which the anode is mounted facing towards the upper surface of a portion of the leadframe. The underside of this portion of the leadframe provides the anode contact to the electronic component. For an n-channel semiconductor power switch, the anode is normally connected to ground potential.

In the so-called flip-chip arrangement, the cathode of the vertical semiconductor power switch positioned on the opposing surface of the semiconductor power switch faces upwards away from the leadframe of the electronic component and is electrically connected to the leadframe, more particularly to a cathode portion of the leadframe, by a contact clip. The contact clip is electrically conductive and is typically provided in the form of a metal foil or sheet with the desired three-dimensional form. Heat may, therefore, be dissipated from the contact clip upwards away from the printed circuit board on which the electronic component is mounted. Therefore, the amount of heat dissipated downwards into a circuit board on which is electronic component is mounted may be reduced. The amount of heat dissipated into neighboring devices mounted on the printed circuit board may also be reduced.

In an embodiment, each portion of the leadframe has a generally cuboid shape. This has the advantage that the height of the electronic component can be reduced and enables the outer contact surfaces of the anode and control portions of the leadframe to be positioned underneath the first surface of the semiconductor power switch. Constantly, the lateral extent of the electronic component is also reduced.

In an embodiment, the majority of the outer contact surface of the anode portion and the majority of the outer contact surface of the control portion is positioned underneath first surface of the semiconductor power switch. The anode portion may have a generally cuboid shape and the cathode portion may have a generally cuboid shape. The majority of these portions may be positioned directly underneath the first surface of the semiconductor power switch. This provides a mechanically stable arrangement and increases the size of the contact areas without enlarging the overall lateral size of the electronic component.

The anode may be mounted on the anode portion and the control electrode may be mounted on the control portion of the leadframe by soft solder or electrically conductive adhesive or a diffusion solder bond.

The phrase "diffusion solder bond" is used in this context to denote a connection structure which is mechanically and electrically attached to a contiguous surface by a layer comprising intermetallic phases. The intermetallic phases are formed as a result of a diffusion soldering process and comprise chemical elements of a diffusion solder and of at least one contiguous material of, for example, the leadframe.

A diffusion solder bond has the advantage that the melting point of the intermetallic phases is higher than the melting point of the diffusion solder itself. Consequently, the bond which is formed as a result of the diffusion solder process has a melt temperature which is higher than the temperature at which the bond is formed. A diffusion solder bond has the advantage that a second semiconductor component may be mounted on the die pad in a second diffusion bonding step without the diffusion solder bond connecting the first semiconductor component to the die pad melting. Consequently, the movement of the semiconductor components during subsequent diffusion solder steps or heat treatment steps, may be avoided. Diffusion solder bonding is, therefore, particularly advantageous for multi-chip modules in which two or more chips or semiconductor components are mounted adjacent to one another directly on the die pad or for multi-chip modules in which two components are stacked one on top of the other.

Diffusion solder bonds are typically thinner than soft solder bonds. Diffusion solder bonds are typically less than 10 μm in thickness whereas soft solder bonds typically have a thickness of around 100 μm. The smaller thickness of the diffusion solder bond has the advantage that the thermal dissipation from the semiconductor component into the die pad is improved and the thermal performance of the package is improved.

A diffusion solder bond has the further advantage that the lateral area occupied by the bond substantially corresponds to the lateral area of the semiconductor component. Consequently, a larger semiconductor power switch can be accommodated on a die attach region of a given size if a diffusion solder bond is used. Since the switching properties of the power switch are dependent on the area of the device, the performance of the component may be improved due to the provision of a larger switch on a die attach region of the same size. The structure for producing the diffusion solder bond, may be fabricated by depositing the structure on the semiconductor component.

In a first embodiment, the diffusion solder bond comprises a contact layer diffusion barrier layer disposed on the contact layer, and a diffusion solder layer disposed on the diffusion barrier layer. The anode may provide the contact layer of the diffusion bond or the anode may comprise the entire structure of the diffusion solder bond.

The contact layer may consist essentially of aluminum or aluminum with 1% Si and the diffusion barrier layer comprise one of the group of consisting of Ti metal and a first layer of consisting essentially of Ti metal and a second layer comprising $TiN_x$. The diffusion solder bond may comprise an alloy, the alloy comprising Sn and one of the group consisting of Ag, Au, Cu and In. The alloy comprises intermetallic phases.

The electrically conductive layer may have a thickness t where $0.1\ \mu m \leq t \leq 100\ \mu m$, preferably $0.1\ \mu m \leq t \leq 10\ \mu m$, more preferably $1.5\ \mu m \leq t \leq 3.5\ \mu m$.

The contact layer may have a thickness a, where $0.01\ \mu m \leq a \leq 10\ \mu m$, preferably $0.1\ \mu m \leq a \leq 1\ \mu m$. The diffusion barrier layer may have a thickness b, where $0.1\ \mu m \leq b \leq 10\ \mu m$, preferably $0.1\ \mu m \leq b \leq 1\ \mu m$. The diffusion solder layer may have a thickness c, where $0.1\ \mu m \leq c \leq 80\ \mu m$, preferably $0.5\ \mu m \leq c \leq 5\ \mu m$.

In an alternative embodiment, the diffusion solder bond comprises a contact layer and a diffusion solder layer. The contact layer comprises one of a metal and an alloy thereof, the metal being one of the group of elements consisting of Ti, Ni and Cr, and the diffusion solder layer comprises an alloy, the alloy comprising Sn and one of the group consisting of Ag, Au, Cu and In.

In a further development of the previous embodiment of the invention, at least one further layer is disposed between the contact layer and the diffusion solder layer. The further layer comprises one of a metal and an alloy thereof, the metal being one of the group of elements Ni, Au, Ag, Pt and Pd.

In an embodiment, the peripheral rim portion of contact clip and the cathode portion of the leadframe are integral or in one piece. The contact clip comprises, in this embodiment, a flat web portion and at least one peripheral rim portion which further comprises the cathode portion of the leadframe. The cathode portion, therefore, extends from the peripheral rim portion of the contact clip and has an underside which provides an outer contact surface of the electronic component. The underside of the cathode portion of contact clip is generally coplanar with the underside of the anode portion and of the control portion of the leadframe so as to provide an electronic component with surface mountable contact surfaces.

In an embodiment, the electronic component comprises a number of cathode outer contact surface which corresponds to the number of peripheral rim portions of the contact clip or contact clips.

A cathode portion which is provided in one piece with the contact clip enables the contact clip to be easily mounted onto the cathode of the vertical semiconductor power switch. Any variation in the height of the semiconductor power switch and any deviation from an ideal position of the cathode with respect to the underside of the anode and control portions of the leadframe can be accommodated by a single joint between the cathode and the flat web portion of the contact clip. The thickness of the joint provided by the adhesive means between the bottom surface of the flat web portion and the cathode is able to accommodate any small variations.

In an embodiment, the peripheral rim portion of the contact clip terminates in a clip rim surface. In this embodiment, the clip rim surface is mounted on the upper surface of a cathode portion of the leadframe. In this embodiment, the leadframe comprises at least one anode portion, at least one control portion and at least one cathode portion, each of which has an underside providing an outer contact area of the electronic component. The cathode portion or portions comprise a portion or portions of the structured metal sheet of the leadframe. The upper surface of the cathode portion may be coplanar with the upper surface of the anode and control portions. In an alternative embodiment, the upper surface of the cathode portion lies in a different plane to the upper surface of the anode and cathode portions. The undersides of all of the portions of the leadframe are advantageously generally coplanar so as to provide surface mountable contact surfaces for the electronic component.

This embodiment enables the footprint of the electronic component, which is provided by the arrangement of the undersides of the leadframe portions, to be determined by the arrangement of the leadframe. The shape and positioning of the contact clip on the cathode as well as on the upper surface of the cathode portion of the leadframe may vary slightly without the outer contact surfaces of the electronic component varying. Consequently, the positioning of the contact clip on the cathode and upper surface of the cathode portion of the leadframe is simplified.

The clip rim surface of the contact clip may be mounted on the upper surface of the cathode portion of the leadframe by soft solder, electrically conductive adhesive or a diffusion solder bond.

The bottom surface of the flat web portion of the contact clip may be mounted on, and electrically connected to, the cathode by soft solder, electrically conductive adhesive or a diffusion solder bond.

In an embodiment of the invention, the electronic component further comprises a plurality of electrically conductive spacer elements, each of which has a height, the height of each of the electrically conductive spacer elements being essentially the same. The plurality of spacer elements are attached to the anode and the control electrode of the vertical semiconductor power switch. In an embodiment, the spacer elements protrude from the anode and the control electrode. The spacer elements each have an outer surface which is mounted on the upper surface of the anode portion or control portion, respectively, of the leadframe. The anode and the control electrode and, consequently, the first surface of the vertical semiconductor power switch, are spaced at a distance corresponding to the height of the spacer elements from the upper surface of the leadframe.

The outer surface of the spacer elements may be mounted on the upper surface of portions of the leadframe by soft solder, electrically conductive adhesive or a diffusion solder bond.

The moisture barrier layer may be positioned on at least part of the exposed surfaces of the spacer elements. In this context, exposed surfaces refers to surfaces not in direct surface-to-surface contact with a further element of the electronic component. The side faces of the spacer elements are, for example, exposed surfaces. In an embodiment, the moisture barrier layer completely covers the exposed surfaces of the spacer elements and in a further embodiment, completely covers the side faces of the spacer elements.

The moisture barrier layer may comprise a passivation layer or silicon nitride or silicon dioxide.

The moisture barrier layer has a thickness t, where 10 nm≦t≦50 μm, preferably 1 μm≦t≦50 μm, more preferably 5 μm≦t≦20 μm. The moisture barrier layer is, therefore, distinguished by its thickness from a normal passivation layer provided on the surface of the semiconductor die and from an encapsulation compound.

The flat web portion of the contact clip may comprise at least one through-hole which, for example, may be positioned so as to expose a region of the cathode of the semiconductor power switch. The flat web portion of the contact clip may cover substantially the whole of the second surface of the cathode and, in an embodiment, has an area which is larger than the area of the second surface of the vertical semiconductor power switch and may extend over two or more edges of the second surface.

In an embodiment, the contact clip comprises two peripheral rim portions which extend from two opposing sides of the flat web portion. In this embodiment, each of the two peripheral rim portions is electrically connected to a cathode portion of the leadframe so that the electronic component comprises two cathode outer contacts positioned in opposing edge regions of the lower surface of the electronic component.

In an embodiment, the contact clip comprises four peripheral rim portions which extend from four sides of the flat Web portion. The flat web portion has an approximately square or rectangular shape. The contact clip may have the form of a can and the electronic component is provided with a cathode outer contact area in the form of an annular ring.

The contact clip which comprises two or four peripheral rim portions may comprise an integral cathode portion positioned at the outer end of each peripheral rim portion to provide a single element. Alternatively, each of the peripheral rim portions may end in a peripheral rim surface, each peripheral rim surface being mounted on a separate cathode portion of the leadframe. The leadframe, therefore, includes a number of cathode portions whose size and position with respect to the anode and control portions of the leadframe corresponds to the number and arrangement of the peripheral rim surfaces of the contact clip.

In a further embodiment, the electronic component comprises two or more contact clips, each of which has a flat web portion a peripheral rim portion.

The vertical semiconductor power switch may be a MOSFET (Metal Oxide Semiconductor Field Effect Transistor) device, a BJT (Bipolar Junction Transistor) device, or IGBT (Insulated Gate Bipolar Transistor) device. For a MOSFET device, the anode is normally called a source electrode, the cathode electrode a drain electrode and the control electrode a gate electrode. For a BJT device, the anode is an emitter electrode, the cathode is a collector electrode and the control electrode is a base electrode. For a IGBT device, the anode is an emitter electrode, the cathode is a collector electrode and the control electrode is a gate electrode.

The application also relates to methods of assembling electronic components. A method for assembling a semiconductor component comprises providing at least one vertical semiconductor power switch. The vertical semiconductor power switch comprises a first surface and second surface and side faces extending between the first surface and the second surface. The first surface comprises at least one anode and at least one control electrode and the second surface comprises at least one cathode. A moisture barrier layer is arranged on at least regions of the first surface of the vertical semiconductor power switch. In an embodiment, a moisture barrier layer is arranged on at least regions of the first surface and on at least regions of the side faces of the vertical semiconductor power switch.

A leadframe is provided which comprises a structured sheet providing a plurality of separate portions. Each portion comprises an upper side and an underside. The underside provides a surface mountable outer contact surface of the electronic component. At least one contact clip is provided which comprises a flat web portion and at least one peripheral rim portion extending from an edge of the flat web portion.

The anode of the vertical semiconductor power switch is mounted on, and electrically connected to, the upper surface of an anode portion of the leadframe and the control electrode of the vertical semiconductor power switch is mounted on, and electrically connected to, a control portion of the leadframe. A bottom surface of the flat web portion of the contact clip is mounted on, and electrically connected to, the cathode of the vertical semiconductor power switch so that the peripheral rim portion extends over and is spaced from an edge of the vertical semiconductor power switch. The peripheral rim portion of the contact clip is electrically connected to a cathode portion of the leadframe. The exposed surfaces of the contact clip, of the moisture barrier layer and of the leadframe provide outer surfaces of the electronic component.

In an embodiment, the peripheral rim portion of the contact clip and the cathode portion are provided as a single element. A contact clip is, therefore, provided which comprises a flat web portion and at least one peripheral rim portion extending from an edge of the flat web portion. The peripheral rim portion extends into a cathode portion comprising an underside which provides an outer contact surface of the electronic component.

In an embodiment, the peripheral rim portion of the contact clip terminates in a clip rim surface. The contact clip, therefore, extends between the cathode and the upper surface of a cathode portion of the leadframe. The bottom surface of the flat web portion is mounted on the cathode and the clip rim surface is mounted on the upper surface of the cathode portion of the leadframe.

The flat web portion of the contact clip may be mounted on, and electrically connected to, the cathode by soft solder, electrically conductive adhesive or diffusion solder. The clip rim surface may be mounted on the upper surface of the cathode portion of the leadframe by soft solder, electrically conductive adhesive or diffusion solder.

The anode of the vertical semiconductor power switch may be mounted on the anode portion of the leadframe and the control electrode may be mounted on the control portion of the leadframe by soft solder, electrically conductive adhesive or diffusion solder.

It is convenient to use the same material to mount the anode on the anode portion and the control electrode on the control portion of the leadframe as both connections can be simply produced in the same process step.

In an embodiment, a plurality of electrically conductive spacer elements are deposited on the anode and on the control electrode of the semiconductor power switch. Each of the spacer elements has a height and is spaced at a distance from its neighbors. Since the control electrode is typically much smaller than the anode, only one spacer element is deposited on the control electrode, in an embodiment. The spacer elements may be produced by selective deposition. Alternatively, a layer may be deposited to the approximate desired height of the spacer elements, and the layer structured to produce a plurality of separate spacer elements, each having a desired height and area.

The anode and the control electrode may be mounted on the anode portion and control portion, respectively, of the leadframe by mounting the outer surface of the spacer elements on the upper surface of the respective portion of the leadframe.

The outer surface of the spacer elements may be mounted on the upper surface of the leadframe by soft solder, electrically conductive adhesive or diffusion solder. A layer of diffusion solder may be deposited on the outer surface of the spacer elements after their deposition on the anode and control electrode of the vertical semiconductor power switch.

A moisture barrier layer may be deposited on at least the first surface of the vertical semiconductor power switch. The moisture barrier layer may be deposited so as to cover the first surface of the vertical semiconductor power switch and, afterwards, be structured to form through-openings exposing regions of the anode and control electrode. A metal or an alloy may then be deposited into the openings to form the spacer elements. In an embodiment, a moisture barrier layer is deposited on the side faces as well as the first surface of the vertical semiconductor power switch.

The metal or alloy may be deposited so that the outer portions of the spacer elements protrude from, and are exposed from, the moisture barrier layer. This may be achieved by a galvanic deposition technique.

In an embodiment of the invention, a plurality of spacer elements is deposited on the anode and control electrode. A moisture barrier layer is then deposited on at least the spacer elements, the side faces and the first surface of the vertical semiconductor power switch. The moisture barrier layer may then be removed from the outer surfaces of the plurality of spacer elements. This provides an electrically conductive surface so that a low electrical resistance contact may be provided between the spacer elements and the leadframe.

In an embodiment, a diffusion solder layer is deposited on the anode and the control electrode of the first surface of the vertical semiconductor power switch. This enables the anode and the control electrode to be mounted on, and electrically connected to, the upper surface of the respective portions of the leadframe by diffusion solder process.

In and embodiment, the portions of the leadframe each have a generally cuboid shape. Generally cuboid includes small overhangs or protrusions from the upper side of the portions of the leadframe.

In an embodiment, the metal sheet is structured so that the anode portion and the control portion of the leadframe have an arrangement such that they are positioned at least in part underneath the first surface of the vertical semiconductor power switch.

FIG. 1 illustrates a view of an electronic component 1 including a vertical MOSFET device 2, a leadframe 3 and a contact clip 4 according to a first embodiment.

The vertical MOSFET device 2 comprises a first lower side 7 which comprises a source electrode 8 and a gate electrode 9 and a second upper side 5 which comprises a drain electrode 6, which extends over the majority of the second side of the MOSFET device 2. The first side 7 is positioned opposing the second side 5 and side faces 23 extend generally perpendicularly to the first side 7 and second side 5. The source electrode 8 is laterally much larger than the gate electrode 9. The gate electrode 9 is positioned in an edge region of the first surface 7 of the MOSFET device 2 and is surrounded on three sides by the source electrode 8 which extends over the majority of the first surface 7. The lateral arrangement of the source electrode 8 and the gate electrode 9 is not illustrated in FIG. 1.

In this context, "upper" and "lower" are defined in relation to the orientation of the electronic component 1 when it is mounted on a circuit carrier such as a printed circuit board. "Upper" is used to denote the side of the MOSFET device 2 which faces upwards and away from the printed circuit board, indicated in FIG. 1 by 10, and "lower" is used to denote the side of the MOSFET device 2 which faces towards the printed circuit board 10.

In this embodiment of the invention, the drain electrode 6 comprises a layer of aluminum with around 1% Si which is disposed directly on the upper surface 5 of the semiconductor body of the MOSFET device 2. The source electrode 8 and the gate electrode 9 are disposed directly on the lower side 7 of the semiconductor body of the MOSFET device 2 and also comprise aluminum with 1% Si. The outermost surface of the drain electrode 6 includes a thin layer 9 of an easily solderable material, such as silver.

The leadframe 3 of the electronic components 1 comprises a gate portion 11, a source portion 12 and two drain portions 13. The portions 11, 12 and 13 of the leadframe 3 are physically separate and are not physically joined. In this embodiment of the invention, the two drain portions 13 are positioned in two opposing edge regions of the electronic component 1 and are provided by a foot region 14 of the contact clip 4.

The gate portion 11 and the source portion 12 each have an upper surface 15 which faces towards the first lower surface 7 of the MOSFET device 2 and a lower surface 16 which provides an outer contact area 17 of the electronic component 1. The gate portion is and source portion 12 of the leadframe 3 are provided by a structured metal sheet and have a thickness which is essentially the same. The upper surface 15 of the source portion 12 and the upper surface 15 of the gate portion in 11 are, therefore, essentially coplanar. The lower surface 16 of the source portion 12 and the lower surface 16 of the gate portion 11 are also essentially coplanar.

The MOSFET device 2 is mounted with its first side 7 comprising the source electrode 8 and gate electrode 9 facing the upper surface 15 of the source portion 12 and gate portion 11 the leadframe 3.

A plurality of spacing elements 18 are disposed on the source electrode 8 and a single spacer element 19 is arranged on the gate electrode 9. The source electrode 8 is attached and electrically connected to the source portion 12 of the leadframe 3 by the spacing elements 18. The gate electrode 9 is attached and electrically connected to the gate portion 11 of the leadframe 3 by the spacing element 18.

The spacing elements 18 and 19 are provided in the form of protrusions, each of which in this embodiment of the invention is laterally essentially square and have essentially the same height. The first surface 7 of the MOSFET 2 is spaced at a distance from the upper surface 15 of the leadframe 3. The spacing elements 18 and 19 were deposited on the source electrode 8 and gate electrode 9 respectively by selective galvanic deposition.

The source portion 12 of the leadframe 3 is laterally larger than the source electrode 8 and protrudes laterally outside the lateral area of the MOSFET device 2. The gate portion of the leadframe 3 is also laterally larger than the gate electrode 9.

The footprint or arrangement of the outer contact areas 17 of the electronic component 1 of the leadframe 3 provided by the underside of the gate portion 11 and source portion 12 has a different arrangement to the arrangement of the gate electrode 9 and source electrode 8 arranged on the first lower surface 7 of the MOSFET device 2. The leadframe 3 and spacing elements 18, 19 provide a rewiring structure so that the footprint of the electronic component 1 is independent of the lateral arrangement of the electrodes on the first surface 7 of the MOSFET device 2. Consequently, different sizes of MOSFET device 2 may be accommodated in the electronic component 1 while the footprint of the electronic component 1 remains the same. Consequently, different grades of MOS- FET devices of different performance they be accommodated within the electronic component 1 and be provided with a single standardized footprint.

The source electrode 8 is mounted on, and electrically connected to, the upper surface 15 of the source portion 12 by a diffusion solder bond 20. Similarly, the spacing element 19 positioned on the gate electrode 9 is electrically connected to the gate portion 11 of the leadframe 3 by a diffusion solder bond 20.

The exposed surfaces 21 spacing elements 18 and 19 and the remaining regions 22 of the lower surface 7 of the MOSFET device 2 which do not include spacer elements 18, 19 and the side faces 23 of the MOSFET device 2 are covered by a moisture barrier layer 24 which has a thickness of approximately the height of the spacer elements 18 and 19.

The semiconductor component 1 further comprises a contact clip 4 which comprises a flat web portion 25 and two peripheral rim portions 26. The flat web portion 25 is laterally larger than the MOSFET device 2 on two opposing sides of the MOSFET device 2. Therefore, a peripheral rim region 26 extends over two opposing side faces 23 of the MOSFET device 2. The bottom surface 27 of the flat web portion 25 is disposed on, and electrically connected to, the drain electrode 6, positioned on the upper side 5 of the MOSFET device 2, by a layer 28 of soft solder.

The contact clip 4 has substantially a U-shape in the view of FIG. 1. Each opposing peripheral rim portion 26 comprises a leg 29 which extends downwards from the flat web portion 25 in directions towards the bottom side 27 of the flat web portion 25. The legs 29 of the peripheral rim portion 26 are spaced at a distance from two opposing side faces 23 of the MOSFET device 2. The leg 29 of each of the peripheral rim portions 26 each include a foot 30 which extends in a direction away from the side face 23 of the MOSFET device 2. The contact clip 4 has essentially a uniform thickness and may be fabricated by stamping and bending a metal foil or sheet.

The lower surface 31 of each of the feet 30 of the peripheral rim portion 26 of the contact clip 4 lies in essentially the same plane as the outer surface 16 of the source portion 12 and of the gate portion 11 of the leadframe 3. The outer surfaces 16 of the gate portion 11, source portion 12 and outer surfaces 31 of the two feet 30 of the peripheral rim portions 26 of the contact clip 4, therefore, provide surface mountable contact surfaces 17 of the electronic component 1.

The contact clip 4 provides the electrical connection between the drain electrode 6 positioned on the upper side 5 of the MOSFET device 2 and the printed circuit board 10. As can be seen in FIG. 1, the surface mountable contact surfaces 17 are essentially coplanar and are mounted on, and electrically connected to, the printed circuit board 10 by soft solder 32. The lower outer surfaces 31 of the feet 30 as well as the lower outer surface 16 of the gate portion 11 and source portion 12 of the leadframe 3 also include an easily solderable layer 33.

The exposed surfaces of the contact clip 4, gate portion 11 and source portion 12 of the leadframe 3 and the exposed surfaces of the moisture barrier layer 24 provide the outer exposed surfaces of the electronic component 1. The electronic component 1 is an encapsulation-free electronic component.

The absence of a plastic encapsulation compound enables a MOSFET device 2 of a larger lateral area to be accommodated within the electronic component 1 without necessitating a change in the footprint provided by the outer contact surfaces 17 of the electronic component 1 since space no longer has to be reserved for clamping a mold on the electronic component 1 or for allowing the flow of encapsulation material around the elements of the electronic component 1.

The spacer elements 18, 19, shape of the contact clip 4 and the provision of the leadframe 3 also provides an electronic component in which the footprint provided by the outer contact surfaces 17 is independent of the lateral arrangement of the electrodes on the lower surface 7 of the MOSFET device 2 since the spacer elements 18, 19 and leadframe 3 provide a three-dimensional rewiring structure. This further increases the flexibility of the electronic component 1 as a range of sizes of MOSFET device 2 can be accommodated in the electronic component 1 and be provided with a standard footprint.

In a further embodiment not shown in figures, the source electrode 8 is mounted on the source portion 12 of the leadframe 3 by a single spacer element 18. The single spacer element 18 may extend over the majority of the lateral area of the source electrode 8.

In a further embodiment not illustrated in the figures, the moisture barrier layer 24 is positioned only on the first surface 7 of the MOSFET device 2. The side faces 23 of the MOSFET 2 remain free from the moisture barrier layer 24.

The electronic component 1 is manufactured by providing a semiconductor wafer including a plurality of MOSFET devices 2 arranged in rows and columns.

The drain electrode 6 is deposited on a second surface 5 of the wafer in each of the plurality of device positions.

The source electrode 8, gate electrode 9 of each of the plurality of MOSFET devices 2 are then deposited on first surface 7 of the wafer and the spacer elements 18, 19 deposited on the source electrode 8 and gate electrode 9 respectively. This may be carried out by depositing a closed metal layer and structuring the metal layer to produce separate spacer elements. Alternatively, a selective deposition process may be carried out to deposit the spacer elements 18, 19. A layer of diffusion solder 21 is then deposited on the outer surface of the spacer elements 18,19 which will be brought into contact with the leadframe 3.

A moisture area layer 24 is provided on at least the exposed portions of the first surface 7 and side faces 23 of the MOSFET device 2. In this context, exposed surfaces refers to those surfaces not covered by a spacing element 18, 19. In the first embodiment, the moisture barrier layer 24 has thickness essentially the same as the height of the spacing elements 18, 19.

A leadframe 3 is provided which has the form of a structured metal sheet comprising a plurality of device positions, each device position providing a leadframe 3 for a single electronic component. In an embodiment, the leadframe 3 comprises a source portion 12 and gate portion 11 in each of the device positions.

The leadframe 3 is then heated to a temperature above the melting point of the diffusion solder and the first surface 7 of the MOSFET device 2 is aligned facing the upper surface 15 of leadframe 3 such that the gate electrode 9 is positioned above the gate portion 11 and the source electrode 8 is positioned above the source portion 12. The diffusion solder layer 21 positioned on the outer surface of each of the spacing elements 18, 19 is brought into contact with the upper surface 15 of the respective portion of the leadframe 3. Intermetallic phases are formed between the material of the diffusion solder 21 and the leadframe 3 which have a higher melting point than the melting point of the diffusion solder. The MOSFET device 2 is, therefore, attached to the gate portion 11 and source portion 12 of the leadframe 3 by the solidification of the interface between the spacer elements 18, 19 and the leadframe 3. The gate portion 11 and source portion 12 of the leadframe 3 therefore provide the chip carrying portions of the leadframe 3.

A contact clip 4 is provided which comprises a flat web portion 25 and two peripheral rim portions 26 which extend on two opposing sides of the flat web portion 25. The flat web potion 25 is provided with an area so that the peripheral rim portions 26 extend over and beyond the side faces 23 of the semiconductor power switch 2 and are not in contact with the side faces 23. Each peripheral rim portion 26 comprises a leg 29 and foot 30. The contact clip 4 is provided with a shape such that the lower surface 31 of the foot 30 of the peripheral rim portion 26 is approximately coplanar with the lower surfaces 16 of the source portion 12 and gate portion 11 when the lower surface 27 of the flat web portion 25 is mounted on the drain electrode 6.

The lower surface 27 of the flat web portion 25 is mounted on the drain electrode 6 by a layer of soft solder 28. Due to the form of the content clip 4, the lower surfaces 31 of the two feet 30 are essentially coplanar with the lower surfaces 16 of the gate portion 11 and of portion 12 leadframe 3 so that these surfaces provide surface mountable outer contact surfaces 17 of the electronic component 1.

The electronic component 1 is not encapsulated. The exposed surfaces 34 of the contact clip 4, leadframe 3 and moisture barrier layer 24 provide the outer surfaces of the electronic component 1.

Figure 2:
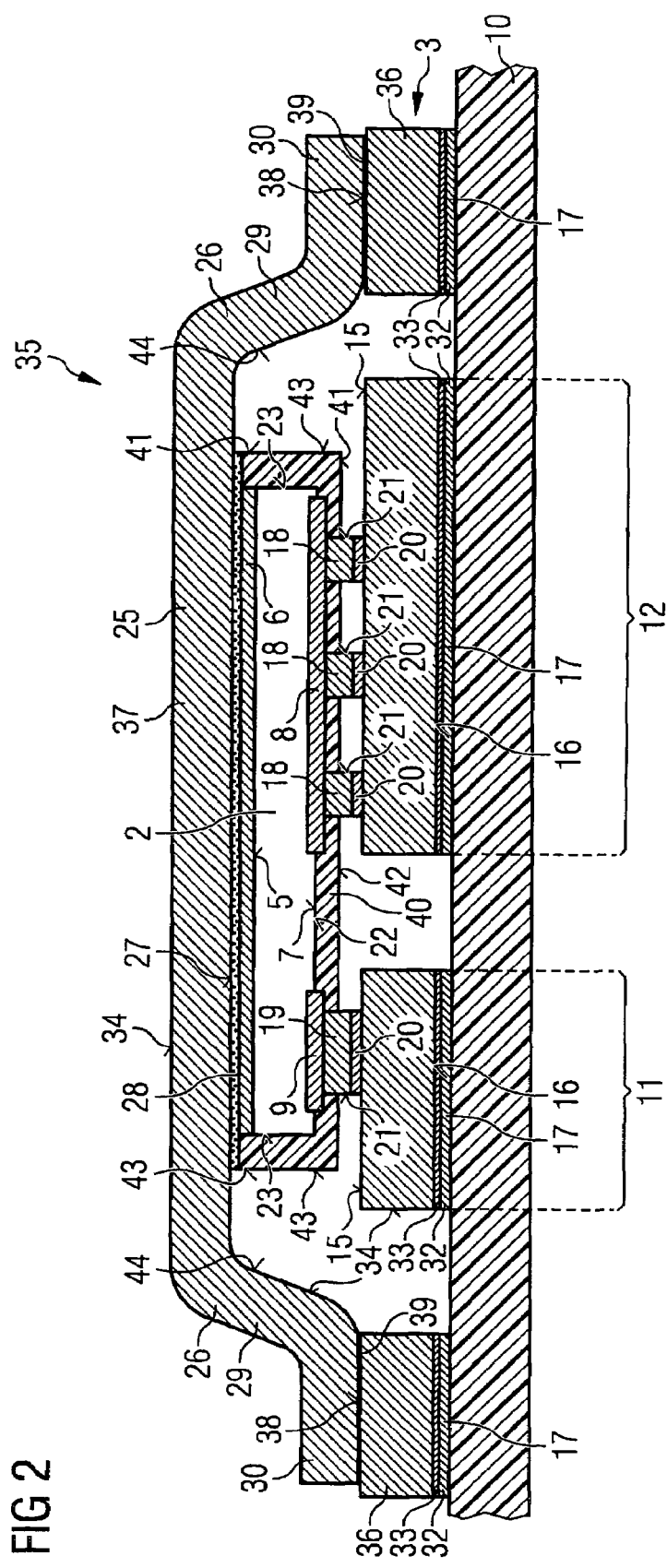
FIG. 2 illustrates an electronic component comprising a vertical MOSFET device according to a second embodiment.

FIG. 2 illustrates an electronic component 35 according to a second embodiment. The electronic component 35 differs from the electronic component 1 illustrated in FIG. 1 by the arrangement of the contact clip 37 and leadframe 3.

In the electronic component 35, the leadframe 3 comprises a gate portion 11, a source portion 12, and two drain portions 36. One drain portion 36 is arranged adjacent the gate portion 11 and a second drain portion 36 is arranged adjacent the source portion 12 so that the gate portion 11 and source portion 12 lie directly between the two drain portions 36 of the leadframe 3. The four portions 11, 12, 36 of the leadframe 3 are fabricated by structuring a metal sheet. The portions 11, 12, 36 of the leadframe 3 are physically separate from one another and each has approximately the same height. The upper surface 15 of the drain portions 36 is therefore approximately coplanar with the upper surface 15 of the gate portion 11 and of the source portion 12.

Similarly to the embodiment shown in FIG. 1, the electronic component 35 comprises a MOSFET device 2 comprising a drain electrode 6 on the upper surface 5 and a source electrode 8 and a gate electrode 9 on the lower surface 7. The MOSFET device 2 is mounted with its first lower surface 7 and, therefore, the gate electrode 9 and source electrode 8 facing towards the upper surface 15 of the leadframe 3. A plurality of spacing elements 18 are positioned between the source electrode 8 and source portion 12 and a single spacer element 19 is positioned the gate electrode 9 and gate portion 11. The MOSFET device 2 is mounted on the leadframe 3 by diffusion solder bonds 21 between the spacer element 19 and gate portion 11 and between the spacer elements 18 and source portion 12 of the leadframe 3. The gate portion 11 and source portion 12 therefore provide the die carrier regions of the leadframe 3.

The electronic component 35 also includes a contact clip 37 which electrically connects the drain contact 6 to the drain portions 36 of the leadframe 3. The contact clip 37 comprises a flat web portion 25 and two peripheral rim portions 26. A peripheral rim portion extends form two opposing sides of the flat web portion 25 and comprises a leg portion 29 and foot 30. The leg 29 extends towards the leadframe 3 from the flat web portion 3 in a direction towards the leadframe 3 and extends into a foot 30 which extends in a direction away from the side face 23 of the MOSFET device 2.

The lower surface 38 of the foot 30 provides a peripheral rim surface and is mounted on the upper surface 15 of the drain portion 36 of the leadframe 3 by soft solder 39. The contact clip 4 is provided with a form such that the MOSFET device 2 is accommodated between the two inner surfaces of the two opposing peripheral rim portions 26. The leg 29 of the peripheral rim portion 26 extends a distance such that the lower surface 38 of the foot 30 is mounted on the upper surface 15 of the drain portion 36 of the leadframe 3 when the bottom surface 27 of the flat web portion 25 is mounted on the drain electrode 6.

This arrangement of the leadframe 3 and contact clip 37 enables a more flexible contacting arrangement between the drain electrode 6 and drain portions 36 of the leadframe 3 since variations in the positioning of the contact clip 37 do not result in variations in the position of the outer contacts surfaces 17 of the electronic component 35. This enables the footprint as defined by the outer contacts surfaces 17 to be reliably provided.

Also in this second embodiment of the invention, the MOSFET device 2 is provided with a thinner moisture barrier layer 40. The moisture barrier layer 40 has a thickness such 30 extends only over base portion of the space element 18, 19. The outer region of the spacer elements 18, 19 and diffusion solder bond 21 remain uncovered by the moisture barrier layer 24.

The electronic component 37 is encapsulation free. The outer exposed surfaces 41 of the moisture barrier layer 40 provide outer surfaces of the electronic component 37. The lower surface 42 of the moisture barrier layer 40 is spaced at a distance from the upper surface 15 of the source portion 12 and gate portion 11 of the leadframe 3. The side faces 43 of the moisture barrier layer 40 are spaced at a distance from the inner faces 44 of the peripheral rim portions 26 of the contact clip 37.

The electronic component 35 is assembled by providing a leadframe 3 which comprises an source portion 12, a gate portion 11 and two drain portions 36 having an arrangement as shown in FIG. 2. A vertical power MOSFET device 2 is provided which comprises a first surface 7 on which the gate electrode 9 and source electrode 8 are positioned. A drain electrode 6 is positioned on the opposing second surface 5 of the MOSFET device 2.

A plurality of spacer elements 18, 19 are deposited on the anode 8 and gate electrode 9 as previously described, and a diffusion solder layer is deposited on the upper outer surface of each of the spacer element 18, 19. A moisture barrier layer 40 is deposited on the exposed regions 22 of the first surface 7 and side faces 23 of the MOSFET device 2 and covers the base region of the spacer elements 18, 19 which is attached to the source electrode 8 and gate electrode 9.

A contact clip 37 is provided which comprises a flat web portion 25 and two peripheral rim portions 26 which extend to form two opposing edges of the flat web portion 25. Each performing portion 26 comprises a leg 29 and foot 30. The underside or lower surface of the foot 30 provides a peripheral rim surface 38.

The leadframe 3 is heated to a temperature above the melting point of the diffusion solder. The MOSFET device 2 is aligned with the leadframe 3 so that the first surface 7 is facing towards the upper surface 15 of the leadframe 3 and the gate electrode 9 is positioned above the gate portion 11 and the source electrode 8 is positioned above the source portion 12 of the leadframe 3. The MOSFET device 2 is brought into contact with the leadframe 3 so that the outer surfaces of the spacer element 18, 19 are brought into surface-to-surface contact with the gate portion 11 and source portion 12 of the leadframe 3, respectively. The MOSFET device 2 is mounted on, and electrically connected to, the gate portion 11 and source portion 12 of leadframe 3 due to the formation of intermetallic phases between the diffusion solder and the leadframe 3 to produce diffusion solder bonds 21.

The contact clip 37 is positioned so that the flat web portion 25 is in contact with the drain electrode 6 and the peripheral rim portion 38 is in contact with the upper surface 15 of the drain portion 36 of leadframe 3. This embodiment of the invention, the contact clip 37 is connected to the drain electrode 6 and drain portions 36 of the leadframe 3 by soft solder joints.

REFERENCE NUMBERS 1 first electronic component
2 MOSFET device
3 leadframe
4 contact clip
5 second upper side
6 drain electrode
7 first lower side
8 source electrode
9 gate electrode
10 printed circuit board
11 gate portion of leadframe
12 source portion of leadframe
13 drain portion of leadframe
14 foot region of contact clip
15 upper surface of gate portion and source portion
16 lower surface of source portion and gate portion
17 outer contact area of electronic component
18 first spacer element
19 second spacer element
20 diffusion solder bond
21 exposed surfaces of spacing elements
22 exposed surface of lower surface of MOSFET
23 side face of MOSFET
24 first moisture barrier layer
25 flat web proportion
26 peripheral rim portion
27 bottom surface of flat web portion
28 soft solder layer
29 leg
30 foot
31 lower surface of foot
32 soft solder layer
33 solder wettable layer
34 outer surface of electronic component
35 second electronic component
36 drain portion of leadframe
37 second contact clip
38 lower surface of the foot
39 soft solder layer
40 second moisture barrier layer
41 outer surface of moisture barrier layer
42 lower surface of moisture barrier layer
43 side face of moisture barrier layer
44 inner surface of peripheral rim portion

I claim:

1. An electronic component comprising:
    at least one vertical semiconductor power switch comprising a first surface and second surface and side faces extending between the first surface and the second surface, wherein the first surface comprises at least one anode and at least one control electrode and the second surface comprises at least one cathode, and wherein a moisture barrier layer is positioned on at least the exposed regions of the first surface;
    a leadframe comprising a structured sheet providing a plurality of separate portions, each portion comprising an upper side and an underside, wherein the underside provides a surface mountable outer contact surface of the electronic component;
    a contact clip having a flat web portion and at least one peripheral rim portion extending from an edge of the flat web portion; and
    a plurality of electrically conductive spacer elements having a height, wherein the spacer elements are attached to the anode and the control electrode of the semiconductor power switch, wherein the outer surface of the spacer elements is mounted on the upper surface of portions of the leadframe, wherein the moisture barrier layer is positioned on exposed surfaces of the spacer elements and on the side faces of the semiconductor power switch,
    wherein the anode of the vertical semiconductor power switch is mounted on the upper surface of an anode portion of the leadframe and the control electrode of the vertical semiconductor power switch is mounted on a control portion of the leadframe, the outer contact surfaces of the anode portion and of the control portion being positioned at least in part underneath the first surface of the vertical semiconductor power switch,
    wherein a bottom surface of the flat web portion of the contact clip is mounted on, and electrically connected to, the cathode, the peripheral rim portion of the contact clip extending over and being spaced from a side face of the vertical semiconductor power switch and being electrically connected to a cathode portion of the leadframe, and
    wherein exposed surfaces of the contact clip, of the moisture barrier layer and of the leadframe provide outer surfaces of the electronic component, and wherein the contact clip is entirely free of a plastic encapsulation mass.

2. The electronic component according to claim 1, wherein each portion of the leadframe has a generally cuboid shape.

3. The electronic component according to claim 1, wherein the majority of the outer contact surface of the anode portion and of control portion is positioned underneath the first surface of the semiconductor power switch.

4. The electronic component according to claim 1, wherein the anode is mounted on the anode portion and the control electrode is mounted on the control portion by one of soft solder, electrically conductive adhesive and a diffusion solder bond.

5. The electronic component according to claim 1, wherein the peripheral rim portion of the contact clip and the cathode portion of the leadframe are integral.

6. The electronic component according to claim 1, wherein the peripheral rim portion of the contact clip terminates in a clip rim surface, the clip rim surface being mounted on the upper surface of a cathode portion of the leadframe.

7. The electronic component according to claim 6, wherein the clip rim surface is mounted on the upper surface of the cathode portion by one of soft solder, electrically conductive adhesive and a diffusion solder bond.

8. The electronic component according to claim 1, wherein the outer surface of the spacer elements is mounted on the upper surface of portions of the leadframe by one of soft solder, electrically conductive adhesive and a diffusion solder bond.

9. The electronic component according to claim 1, wherein the moisture barrier layer covers exposed surfaces of the spacer elements.

10. The electronic component according to claim 1, wherein the moisture barrier layer comprises one of SiN and $SiO_2$.

11. The electronic component according to claim 1, wherein the moisture barrier layer comprises a thickness t, where 10 nm≦t≦50 μm.

12. The electronic component according to claim 1, wherein the flat web portion of the contact clip comprises at least one through-hole.

13. The electronic component according to claim 1, wherein the flat web portion of the contact clip covers substantially the whole of the second surface of the cathode.

14. The electronic component according to claim 1, wherein the contact clip comprises two peripheral rim portions which extend from two opposing sides of the flat web portion.

15. The electronic component according to claim 1, wherein the contact clip comprises four peripheral rim portions which extend from four sides of the flat web portion.

16. The electronic component according to claim 1, wherein said vertical semiconductor power switch is one of a MOSFET device, wherein the anode is a source electrode, the cathode electrode is a drain electrode and the control electrode is a gate electrode, a BJT device, wherein the anode is an emitter electrode, the cathode is a collector electrode and the control electrode is a base electrode and a IGBT device, the anode is an emitter electrode, the cathode is a collector electrode and the control electrode is a gate electrode.

17. The electronic component according to claim 1, wherein the moisture barrier layer comprises a thickness t, where 1 μm≦t≦50 μm.

18. The electronic component according to claim 1, wherein the moisture barrier layer comprises a thickness t, where 5 μm≦t≦20 μm.

19. The electronic component of claim 1, wherein the spacer elements each protrude a distance from a surface of the moisture barrier such that the side surfaces of the spacer elements remain exposed.

20. An electronic component comprising:
at least one vertical semiconductor power switch comprising a first surface and second surface and side faces extending between the first surface and the second surface, wherein the first surface comprises at least one anode and at least one control electrode and the second surface comprises at least one cathode;
a leadframe comprising a structured sheet providing a plurality of separate portions, each portion comprising an upper side and an underside, wherein the underside provides a surface mountable outer contact surface of the electronic component;
a contact clip having a flat web portion and at least one peripheral rim portion extending from an edge of the flat web portion;
a moisture barrier disposed on at least a portion of the first surface of the semiconductor power switch; and
a plurality of electrically conductive spacer elements having a height, wherein the spacer elements are attached to the anode and the control electrode of the semiconductor power switch, wherein the outer surface of the spacer elements is mounted on the upper surface of portions of the leadframe, wherein the moisture barrier layer is positioned on exposed surfaces of the spacer elements and on the side faces of the semiconductor power switch,
wherein the anode of the vertical semiconductor power switch is mounted on the upper surface of an anode portion of the leadframe and the control electrode of the vertical semiconductor power switch is mounted on a control portion of the leadframe, the outer contact surfaces of the anode portion and of the control portion being positioned at least in part underneath the first surface of the vertical semiconductor power switch, and
wherein a bottom surface of the flat web portion of the contact clip is amounted on and electrically connected to the cathode, the peripheral rim portion extending over and being spaced from a side face of the vertical semiconductor power switch and being electrically connected to a cathode portion of the leadframe, and
wherein exposed surfaces of the contact clip and of the leadframe provide outer surfaces of the electronic component, and wherein the contact clip is entirely free of a plastic encapsulation mass.

21. The electronic component of claim 20, wherein the spacer elements each protrude a distance from a surface of the moisture barrier such that the side surfaces of the spacer elements remain exposed.

22. An electronic component comprising:
a vertical semiconductor power switch comprising a first surface and second surface and side faces extending between the first surface and the second surface, wherein the first surface comprises an anode and a control electrode and the second surface comprises a cathode;
a moisture barrier layer disposed on the first surface;
a leadframe comprising a surface mountable outer contact surface of the electronic component;
a contact clip having a flat web portion and a peripheral rim portion extending from an edge of the flat web portion, and
a plurality of electrically conductive spacer elements having a height, wherein the spacer elements are attached to the anode and the control electrode of the semiconductor power switch, wherein the outer surface of the spacer elements is mounted on the upper surface of portions of the leadframe, wherein the moisture barrier layer is positioned on exposed surfaces of the spacer elements and on the side faces of the semiconductor power switch,
wherein the anode is mounted on a first portion of the leadframe and the control electrode is mounted on a second portion of the leadframe,
wherein the flat web portion of the contact clip is electrically connected to the cathode, and the peripheral rim portion of the contact clip extends over and is spaced from a side face of the vertical semiconductor power switch and is electrically connected to a third portion of the leadframe, and
wherein an entire surface of the contact clip facing away from the vertical semiconductor power component, at least a portion of a surface of the moisture barrier layer, and at least a portion of a surface of the leadframe provide outer surfaces of the electronic component.

23. The electronic component of claim 22, wherein the electronic component is entirely free of a plastic encapsulation mass.

24. The electronic component of claim 22, wherein the spacer elements each protrude a distance from a surface of the moisture barrier such that the side surfaces of the spacer elements remain exposed.

* * * * *

UNITED STATES PATENT AND TRADEMARK OFFICE
CERTIFICATE OF CORRECTION

PATENT NO.       : 7,663,212 B2
APPLICATION NO.  : 11/277105
DATED            : February 16, 2010
INVENTOR(S)      : Ralf Otremba It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 837 days.

Signed and Sealed this

Fourth Day of January, 2011

David J. Kappos
*Director of the United States Patent and Trademark Office*